(12) United States Patent
Haehn et al.

(10) Patent No.: US 6,623,992 B1
(45) Date of Patent: Sep. 23, 2003

(54) SYSTEM AND METHOD FOR DETERMINING A SUBTHRESHOLD LEAKAGE TEST LIMIT OF AN INTEGRATED CIRCUIT

(75) Inventors: Steven L. Haehn, Ft. Collins, CO (US); Christopher D. Macchietto, Ft. Collins, CO (US); Mitchel E. Lohr, Windsor, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/094,549

(22) Filed: Mar. 8, 2002

(51) Int. Cl.[7] .............................................. H01L 21/00
(52) U.S. Cl. ......................... 438/11; 438/18; 438/400; 438/469
(58) Field of Search .......................... 438/11, 18, 400, 438/469

(56) References Cited

U.S. PATENT DOCUMENTS

| | | | | |
|---|---|---|---|---|
| 5,712,857 A | * | 1/1998 | Whitman et al. | ............ 714/724 |
| 5,789,933 A | * | 8/1998 | Brown et al. | ................ 324/765 |
| 5,929,650 A | * | 7/1999 | Pappert et al. | .............. 324/763 |
| 5,986,283 A | * | 11/1999 | Bush et al. | ..................... 257/48 |
| 6,140,832 A | * | 10/2000 | Vu et al. | ...................... 324/765 |
| 6,165,807 A | * | 12/2000 | Lee et al. | ...................... 438/18 |
| 6,239,607 B1 | * | 5/2001 | Maxwell et al. | ............ 324/765 |

* cited by examiner

Primary Examiner—David Nelms
Assistant Examiner—Dao H. Nguyen
(74) Attorney, Agent, or Firm—Conley, Rose & Tayon

(57) ABSTRACT

A method and a means for determining an $I_{DDQ}$ test limit of an integrated circuit are provided. In particular, a method is provided which includes measuring the $I_{DDQ}$ value of a test structure formed upon a die derived from the same lot of wafers as an integrated circuit. The method may further include setting the $I_{DDQ}$ test limit based upon the measured $I_{DDQ}$ value. In some embodiments, setting the $I_{DDQ}$ test limit may include correlating the $I_{DDQ}$ value of the test structure to calibration data. Accordingly, a means for conducting such a method may include one or more test structures formed upon a die and calibration data adapted to correlate a test structure $I_{DDQ}$ value to an $I_{DDQ}$ test limit of an integrated circuit. In some cases, the means for determining the $I_{DDQ}$ test limit may further include a means for increasing a substrate leakage current of the test structure.

26 Claims, 1 Drawing Sheet

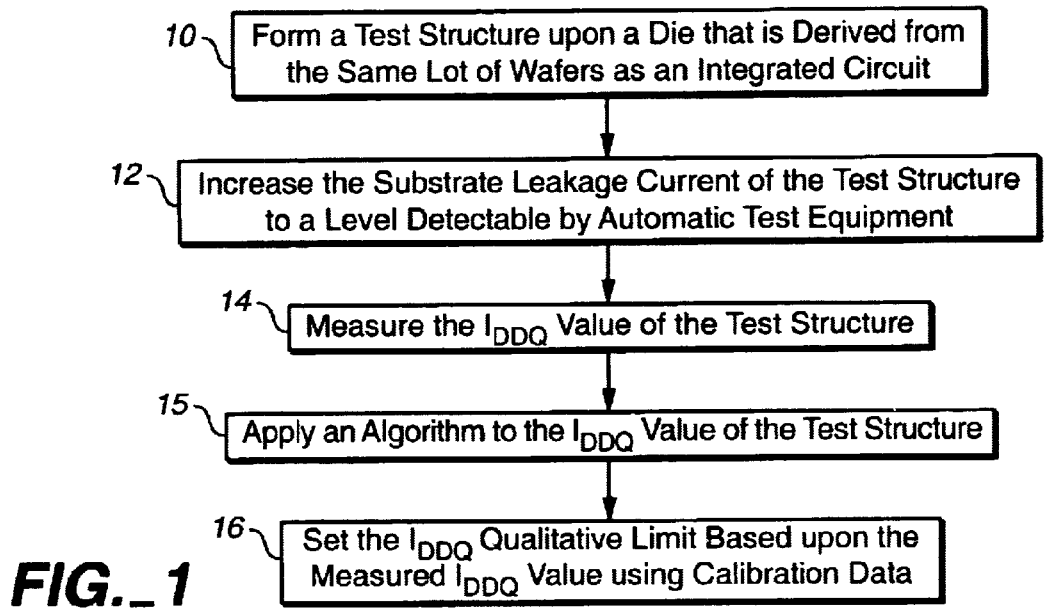
*FIG._1*
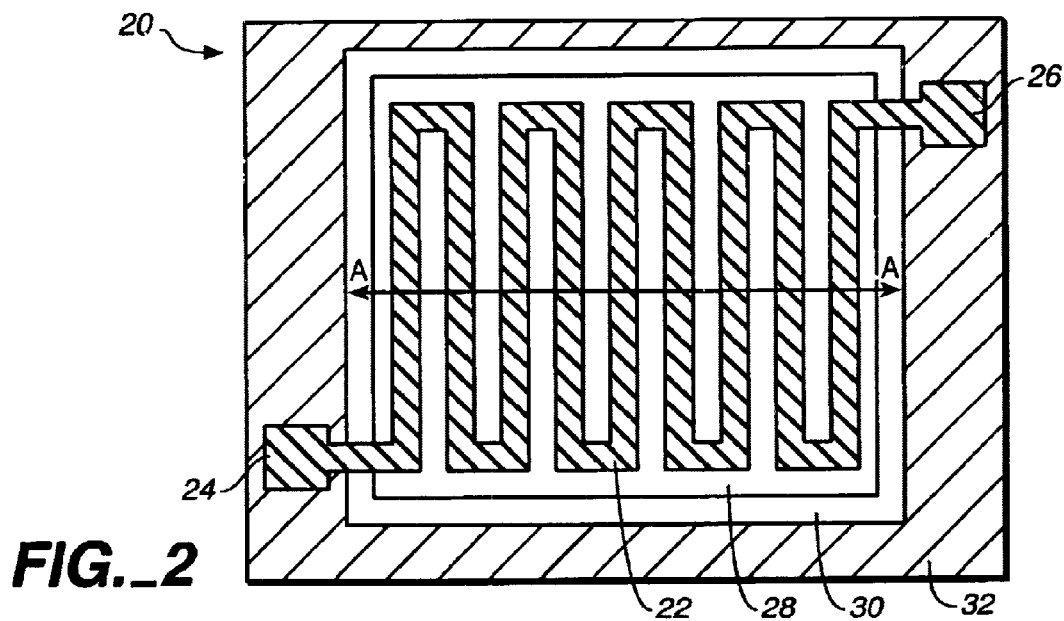
*FIG._2*
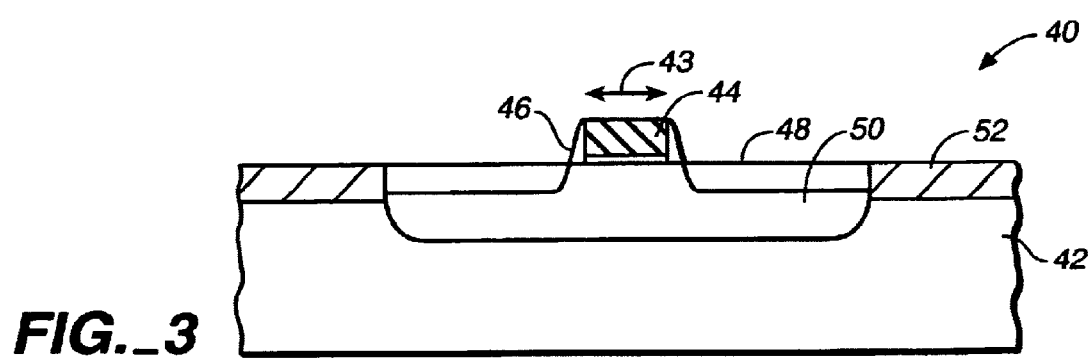
*FIG._3*

SYSTEM AND METHOD FOR DETERMINING A SUBTHRESHOLD LEAKAGE TEST LIMIT OF AN INTEGRATED CIRCUIT

BACKGROUND OF THE INVENTION

1. Field of the Invention

This invention relates to semiconductor device testing, and more specifically to determining an $I_{DDQ}$ qualification limit for an integrated circuit.

2. Description of the Related Art

The following descriptions and examples are not admitted to be prior art by virtue of their inclusion within this section.

Complementary metal oxide silicon (CMOS) integrated circuits are used in a variety of applications due to their low power consumption characteristics. In particular, CMOS circuits typically require low voltage and/or current levels and thus, are included in a variety of devices. In general, an ideal CMOS circuit conducts a negligible amount of current when in a standby or a quiescent state. Such a standby state current is primarily caused by substrate leakage and may be referred to as the source to drain quiescent current ($I_{DDQ}$), the quiescent current, or the substrate leakage current. When the CMOS is in an active state, the current in the device may be referred to as the source to drain dynamic current ($I_{DD}$) or saturation current. In some embodiments, however, the presence of a defect within a circuit may undesirably affect current flow through the circuit. In particular, a defect may increase or limit the flow of current through the circuit while in a standby or active state. Such an alteration of current flow may undesirably affect the functionality of the circuit, rendering the device defective.

Therefore, in the manufacture of semiconductor devices, it is important to test for defects such that the shipment of defective devices may be prevented. Such testing may occur during the fabrication of the devices and/or after the fabrication of the devices. One well-known method of testing circuits in the semiconductor fabrication industry is "static $I_{DD}$ testing" or "$I_{DDQ}$ testing." The test is conventionally used to screen for reliability defects, such as open and short circuits, in CMOS memory and logic devices. In general, the test measures the amount of substrate leakage current or $I_{DDQ}$ current through a circuit. The amount of $I_{DDQ}$ current in a circuit is typically a good indication of chip quality. In particular, the lower the magnitude of the $I_{DDQ}$ current, the better the chip quality. As stated above, defects may cause an increase in $I_{DDQ}$ current within a circuit. As such, a circuit with one or more defects may draw a significantly larger amount of quiescent current than a circuit comprising fewer or no defects. Consequently, $I_{DDQ}$ testing may be used to determine the presence of defects within a circuit. In addition, $I_{DDQ}$ testing may be used to segregate defective devices from non-defective devices.

Typically, $I_{DDQ}$ testing involves setting a threshold value of current by which to either pass or reject the circuit (i.e., deem the circuit non-defective or defective). For example, if the $I_{DDQ}$ current conducted by the circuit exceeds the threshold value, the circuit will be deemed "defective" such that it is not sold to a customer. Alternatively, if the $I_{DDQ}$ current conducted by the circuit is less than the threshold value, the circuit will be deemed non-defective and be passed on for further processing. Currently, the threshold value is determined by analysis of empirical data and is set periodically for a given process. Such a process, however, does not account for lot-to-lot, wafer-to-wafer, or across wafer variation within a fabrication process. As such, the set threshold value may not be representative of the substrate leakage current of a circuit within a specific lot of wafers, a single wafer, or within a region of a wafer. In addition, there is generally a trade-off between passing quality circuits and producing acceptable production yields when setting such a threshold value. In particular, if the threshold value is set too high, circuits with defects may be passed through, thereby degrading the overall quality of the circuit population. In contrast, if the threshold value is set too low, circuit without defects may be rejected by the $I_{DDQ}$ test, thereby unnecessarily reducing production yield.

Another disadvantage of current $I_{DDQ}$ testing methods is that they can only detect defects that cause an $I_{DDQ}$ current larger than the background leakage current (i.e., the substrate leakage current of the device when no defects are present in the circuit). As such, current $I_{DDQ}$ testing methods require low background leakage current while in the quiescent state. As dimensions of semiconductor devices become smaller, however, the background leakage current of devices increases. For example, smaller channel lengths generally result in greater background leakage current. In addition, the reduction of semiconductor device sizes has enabled more transistors to be fabricated on a die, thereby increasing the overall background leakage current. Furthermore, smaller transistors typically produce lower saturation current, thereby reducing the variation between the $I_{DDQ}$ current and $I_{DD}$ current.

Therefore, it would be advantageous to create a method for determining an $I_{DDQ}$ threshold value for an integrated circuit that overcomes the limitations of conventional techniques used for determining such values. Such a method may be particularly advantageous for determining a threshold value of an integrated circuit within a specific lot, wafer, or a region of a wafer.

SUMMARY OF THE INVENTION

The problems outlined above are in large part addressed by a method for determining an $I_{DDQ}$ test limit of an integrated circuit. In particular, a method is provided which includes measuring the $I_{DDQ}$ value of a test structure formed upon a die and setting the $I_{DDQ}$ test limit of an integrated circuit based upon the measured $I_{DDQ}$ value of the test structure. In a preferred embodiment, the die may be derived from the same lot of wafers as the integrated circuit. In some embodiments, the die may be derived from the same wafer as the integrated circuit. In particular, the die upon which the test structure is formed may be derived from the same region of the wafer as the die upon which the integrated circuit is formed. In some cases, the die upon which the test structure is formed may include the integrated circuit. In addition or alternatively, the method may further include forming one or more test structures on each die of the lot of wafers. In some cases, the method may include measuring $I_{DDQ}$ values of a plurality of the one or more test structures and setting the $I_{DDQ}$ test limit of the test integrated circuit based upon the measured $I_{DDQ}$ values. In either embodiment, the method may be conducted when the die is included within a semiconductor wafer or when the die is separated from a wafer. As such, the method may further include dicing each wafer of the lot of wafers, in which the test structure and integrated circuit are formed. In some embodiments, measuring the $I_{DDQ}$ value of the test structure may be conducted prior to dicing each wafer. In other embodiments, measuring the $I_{DDQ}$ value of the test structure may be conducted subsequent to dicing each wafer.

In some cases, setting the $I_{DDQ}$ test limit may include correlating the $I_{DDQ}$ value of the test structure to calibration data to determine the $I_{DDQ}$ test limit. As such, a means for determining an $I_{DDQ}$ test limit of an integrated circuit is also contemplated herein. Such a means may include a test structure and calibration data that is adapted to correlate an $I_{DDQ}$ value measured from the test structure to an $I_{DDQ}$ test limit of the integrated circuit. In some embodiments, the test structure may be formed upon a die, which is derived from the same lot of wafers as a die upon which the integrated circuit is formed. In some cases, the test structure may be formed upon the same die as the integrated circuit. In yet other cases, the means for determining an $I_{DDQ}$ test limit of an integrated circuit may include one or more additional test structures formed upon other die that are derived from the same lot of wafers as the die upon which the integrated circuit is formed. In such an embodiment, the calibration data may be further adapted to correlate $I_{DDQ}$ values measured from the one or more additional test structures to the $I_{DDQ}$ test limit of the integrated circuit. In either embodiment, the test structure is preferably electrically isolated from the integrated circuit.

In some embodiments, the test structure may include an aspect ratio sufficient to generate a substrate leakage current of the test structure to a level detectable by the automatic test equipment used to measure the $I_{DDQ}$ current of the test structure. In addition or alternatively, the means for determining an $I_{DDQ}$ test limit of an integrated circuit may include a means for increasing a substrate leakage current of the test structure to a level detectable by the automatic test equipment used to measure the $I_{DDQ}$ current of the test structure. In some embodiments, the means for increasing the substrate leakage current of the test structure may be adapted to increase the substrate leakage current of the test structure to a level of the same order of magnitude as an intrinsic substrate leakage current of the integrated circuit. In one case, the means for increasing the substrate leakage current of the test structure may include a substrate back bias. Such a back bias may be applied internally though the use of a back bias generator or may be applied by an external source. In other embodiments, the means for increasing the substrate leakage current of the test structure may include a system adapted to increase the temperature of the test structure, such as an internal resistance network or an external heat source.

In some embodiments, the method may further include applying a back bias to the test structure prior to measuring the $I_{DDQ}$ value of the test structure. In addition or alternatively, the method may include raising a temperature of the test structure prior to measuring the $I_{DDQ}$ value of the test structure. In some embodiments, the application of a back bias and/or the increase in temperature may be adapted to increase a substrate leakage current of the test structure to a level detectable by the automatic test equipment used to measure the $I_{DDQ}$ current of the test structure. In some cases, the application of the back bias and/or the increase in temperature may be adapted to increase a substrate leakage current of the test structure to a level of the same order of magnitude as an intrinsic substrate leakage current of the integrated circuit.

The method as described herein may offer several benefits. For example, the method may allow a threshold value to be set based upon the $I_{DDQ}$ value of a test structure formed using the same fabrication process conditions as that used to form an integrated circuit. In this manner, a threshold value may be set specifically for the integrated circuit being measured. More specifically, the threshold value may be set specifically for an integrated circuit formed within the same lot, wafer, or region of a wafer as the test structure. In this manner, variations of background leakage currents within lots of wafer, single wafers, or regions of wafers may be accounted for. Consequently, such a method may reduce or eliminate the trade-off of passing quality circuits and producing acceptable production yields during $I_{DDQ}$ testing. In addition, the method allows the $I_{DDQ}$ test limit of an integrated circuit to be determined when the die upon which the integrated circuit is formed is arranged within a semiconductor wafer or when such a die is separated from a wafer. In this manner, the $I_{DDQ}$ test limit of an integrated circuit may be determined during the fabrication of the device or after packaging of the device.

BRIEF DESCRIPTION OF THE DRAWINGS

Other objects and advantages of the invention will become apparent upon reading the following detailed description and upon reference to the accompanying drawings in which:

FIG. 1 depicts a flowchart of a method for determining the $I_{DDQ}$ test limit of an integrated circuit;

FIG. 2 depicts a partial top view of a test structure formed upon a die; and

FIG. 3 depicts a partial cross-sectional view of a test structure formed upon a die.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning to the drawings, an exemplary embodiment of a method for determining an $I_{DDQ}$ test limit for an integrated circuit is illustrated in FIG. 1. In addition, different cross-sectional views of exemplary test structures used to conduct a method for determining an $I_{DDQ}$ test limit for an integrated circuit are shown FIGS. 2 and 3. The $I_{DDQ}$ test limit of an integrated circuit may refer to the threshold value of $I_{DDQ}$ current by which to either pass or reject the circuit (i.e., deem the circuit defective or non-defective) during $I_{DDQ}$ testing. In particular, an integrated circuit with an $I_{DDQ}$ current less than value of the $I_{DDQ}$ test limit may be considered non-defective and thus, may be passed on for further processing. In contrast, an integrated circuit with an $I_{DDQ}$ current greater than the value of the $I_{DDQ}$ test limit may be considered defective and therefore, prevented from being shipped to a customer.

In some embodiments, the method may include forming a test structure upon a die of a wafer. In a preferred embodiment, the die upon which the test structure is formed may be derived from the same lot of wafers as a die upon which an integrated circuit is formed as shown in step 10 of FIG. 1. In this manner, the test structure and the integrated circuit for which the $I_{DDQ}$ test limit may be determined may be processed using similar processing conditions. In some cases, step 10 may include forming one or more test structures on each die of the wafer upon which the test structure is formed. In some embodiments, step 10 may include forming one or more test structures on each die of the lot of wafers from which the test structure and integrated circuit are derived. In an alternative embodiment, the method may not include step 10. Consequently, the method may start with step 12 or 14. In such an embodiment, the test structure used by the method may be previously fabricated upon a die, which is derived from the same lot of wafers as a die upon which the integrated circuit is fabricated. In this manner, the method may be used for determining an $I_{DDQ}$ test limit of a pre-fabricated integrated circuit in some cases.

In either embodiment, the die upon which the test structure is formed may be derived from a variety of locations within the lot of wafers of the integrated circuit. In general, the closer the test structure is to the circuit, the greater the probability of the $I_{DDQ}$ value of the test structure correlating to the $I_{DDQ}$ current of the integrated circuit. As such, in some embodiments, the die upon which the test structure is formed may include the integrated circuit. In this manner, each semiconductor die region comprising an integrated circuit within a wafer or lot of wafers may include a test structure by which to determine an $I_{DDQ}$ test limit of the integrated circuit. Alternatively, the $I_{DDQ}$ test limit of an integrated circuit may be determined by a test structure arranged upon a die that is separate from the semiconductor die region of the integrated circuit. For example, the test limit for a specific die may be determined by using the test structures of neighboring die or from the test structure of die from another wafer or lot of wafers. In some cases, the die upon which the test structure is formed may be derived from the same wafer as the integrated circuit, but separate from the die region in which the circuit is formed. In some embodiments, the die upon which the test structure is formed may be derived from the same section of the wafer as the integrated circuit, such as the outer edge, the center, or a specific quadrant of the wafer. Various other regions may be appropriate depending on the process conditions of the fabrication process and the level of accuracy desired for the $I_{DDQ}$ test limit.

Whether the test structure is formed within the same semiconductor die region as the integrated circuit or separate from such a semiconductor die region, the test structure may be used to determine the $I_{DDQ}$ test limit of a plurality of integrated circuits formed within the same wafer or lot of wafers as the test structure. In addition, the wafer or lot of wafers comprising the integrated circuit may include one or more test structures by which to determine $I_{DDQ}$ test limits of a plurality of integrated circuits. Preferably, the $I_{DDQ}$ test limit of an integrated circuit is determined by the nearest test structure arranged within the wafer or lot of wafers.

An exemplary embodiment of a test structure is shown in FIG. 2. In particular, FIG. 2 illustrates a top view of test structure 20 formed within well 30 and isolated by field oxide region 32. Test structure 20 may include transistor gate 22 with contact pads 24 and 26 on either end. In addition, test structure 20 may include diffusion regions 28 arranged laterally adjacent to segments of transistor gate 22 within well 30. In general, the arrangement of diffusion regions may be more easily illustrated in a cross-sectional view of a test structure as shown and described in test structure 40 of FIG. 3 below. FIG. 2 shows test structure 20 with meandering transistor gate 22. Such a configuration may be particularly useful for determining if the formation of defects is prevalent in the fabrication process of the integrated circuit. In particular, such a configuration may be useful for detecting defects that cause reliability issues such as open or short circuits. Other test structure configurations, however, may be used depending on the design specifications of the integrated circuit. For example, test structure 20 may include more or fewer meandering segments. In addition or alternatively, the meandering segments may be substantially non-uniform. In particular, the meandering segments may be arranged asymmetrically or spaced unequally across well 30. In some cases, the design rules of the test structure may be substantially similar to the configuration of the integrated circuit for which an $I_{DDQ}$ test limit is to be determined.

A cross-sectional view of a similar test structure is shown in FIG. 3. In particular, a cross-sectional view of test structure 40 is shown with transistor gate 44 laterally interposed between diffusion regions 48 within well 50. In some embodiments, test structure 40 may include spacers 46 by which to mask the introduction of impurities to form diffusion regions 48. In addition, test structure 40 may be interposed between field oxide regions 52 such that the test structure may be isolated from adjacent devices. FIG. 3 illustrates test structure 40 with a single segment of transistor gate 44 interposed between field oxide regions 52, indicating that at that particular point in the cross-sectional view of test structure 40 no other portions of the transistor gate are arranged between field oxide regions 52. As such, test structure 40 may, in such an embodiment, include a substantially straight transistor gate. Alternatively, test structure 40 may include a meandering transistor gate. In such an embodiment, the meandering portion of the transistor gate may not be within the cross-sectional view of FIG. 3. The cross-sectional view of a meandering portion of a transistor gate, however, may include a plurality of segments spaced between field oxide regions. For example, the cross-sectional view of test structure 20 of FIG. 2 taken along line A—A may include nine device segments, each representing a meandering portion of transistor gate 22 arranged in parallel between contact pads 24 and 26.

In accordance with the variations of transistor gate segment arrangements of test structures, the length and width of a transistor gate attributed with a test structure may vary. In general, the width of a transistor gate of a test structure may be referred to as the combined length of the transistor gate between its respective ends. For example, the width of transistor gate 22 of FIG. 2 may be the combined length of transistor gate 22 between contact pads 24 and 26. In addition, the length of a transistor gate may be referred to as the size of the transistor gate between adjacent diffusion regions. For example, the length of transistor gate 22 in FIG. 2 may be referred to as the length of a segment of transistor gate 22 between diffusion regions 28. In the cross-sectional view of FIG. 3, the length 43 may be referred to as the length of transistor gate 44.

In general, the ratio of the width of the transistor gate to the length of the transistor gate may be referred to as the aspect ratio of the test structure. In some embodiments, the aspect ratio may be a factor used to design a test structure. For example, it may be advantageous to fabricate a test structure with an aspect ratio sufficient to generate a substrate leakage current large enough to be detectable by the automatic test equipment used to measure the $I_{DDQ}$ current of the test structure as described in more detail below in step 14. In some embodiments, such a sufficient substrate leakage current may be on the same order of magnitude as the intrinsic level of substrate leakage current of the integrated circuit for which an $I_{DDQ}$ test limit is to be determined. In yet other cases, such a sufficient substrate leakage current may be substantially equal to the intrinsic level of substrate leakage current of the integrated circuit for which an $I_{DDQ}$ test limit is to be determined. Alternatively, such a sufficient substrate leakage current may be substantially lower than the intrinsic level of substrate leakage current of the integrated circuit for which an $I_{DDQ}$ test limit is to be determined but yet still large enough to be detectable by automatic test equipment. In general, the higher the aspect ratio of a test structure, the higher the substrate leakage of the test structure. In this manner, test structures with high aspect ratios may be particularly advantageous for measuring $I_{DDQ}$ current. The correlation of the $I_{DDQ}$ value and aspect ratio of a test structure with respect to an $I_{DDQ}$ test limit of an integrated circuit is described in more detail below with reference of step 16 of the method of FIG. 1.

In some embodiments, the method for determining the $I_{DDQ}$ test limit of an integrated circuit may include step 12 as shown in FIG. 1 in which the substrate leakage current of the test structure may be increased. In some embodiments, the substrate leakage current may be increased to a level detectable by the automatic test equipment used to measure the $I_{DDQ}$ current of the test structure. In addition or alternatively, the substrate leakage current may be increased to a level on the same order of magnitude as the intrinsic level of substrate leakage current of the integrated circuit. In some cases, the substrate leakage current may be increased to a level that is substantially equal to the intrinsic level of substrate leakage current of the integrated circuit. The inclusion of step 12 may be particularly advantageous in an embodiment in which the aspect ratio of the test structure is not sufficient to generate a substrate leakage current large enough to be detectable by automatic test equipment used to measure the $I_{DDQ}$ current of the test structure. Step 12, however, may be included in embodiments in which the aspect ratio of the test structure is sufficient to generate a substrate leakage current large enough to be detectable by such automatic test equipment. In other embodiments, step 12 may be omitted from the method such that the substrate leakage current is not increased.

An increase of substrate leakage current may be generated in a variety of manners. For instance, a back bias may be applied to the test structure in order to increase the substrate leakage current of the test structure. Such a back bias may be fabricated within the test structure. In alternative embodiments, the back bias may be independent of the test structure. In yet another embodiment, a device may be included with the test structure to increase the temperature of the test structure. Such an increase in temperature may increase the substrate leakage current of the test structure. Various devices may be used to increase the temperature of the test structure. For example, a resistance network may be incorporated within the fabrication of the test structure or may be separate from the test structure to increase the temperature of the test structure. In other embodiments, heat may be applied by an external heat source. For instance, in some embodiments, heat may be applied to a chuck on which the die is positioned. In yet other embodiments, both a back bias and a device for raising the temperature of the test structure may be used to increase the substrate leakage current of the test structure.

The method may continue to step 14 to measure the $I_{DDQ}$ value of the test structure as shown in FIG. 1. In some cases, the method may include measuring $I_{DDQ}$ values of a plurality of test structures. In either embodiment, such a measurement process may involve stepping through many different combinations of input test vectors to exercise the functionality of the test structure. For example, different supply voltages may be used to test the structure at different operating voltages. The test vectors may be generated by the automatic test equipment (ATE) used to measure the $I_{DDQ}$ current of the test structure or by integrated circuit designers.

In general, measuring the $I_{DDQ}$ value of the test structure may include measuring the current of the device between a supply voltage, $V_{DD}$, and ground voltage, $V_{SS}$, while the device is in standby mode. More specifically, measuring the $I_{DDQ}$ value of the test structure may include measuring the current between the source and drain regions of the test structure while the test structure is in standby mode. The supply voltage may be applied to either the gate or well of the test structure depending on the polarity of the device. For example, in an embodiment in which the test structure includes a p-type channel, a positive voltage supply may be applied to the gate and well. Conversely, in an embodiment in which the test structure includes an n-type channel, a negative voltage supply may be applied to the gate and well. In some embodiments, the voltage applied to the well may be increased/decreased depending on transistor type (n-channel/p-channel) to cause the substrate leakage current of the test structure to increase. In such an embodiment, such an increase/decrease in the voltage supply may serve as a well back bias. In either embodiment, voltage level applied to the test structure may depend on the design specifications of the integrated circuit for which an $I_{DDQ}$ test limit is being determined and dimensions and/or materials of the test structure.

In some embodiments, the method may include applying the $I_{DDQ}$ value of the test structure to an algorithm as indicated in step 15. Alternatively, step 15 may be omitted from the method. In some cases, the algorithm may be used to determine whether an $I_{DDQ}$ value of a test structure should be used to set an $I_{DDQ}$ test limit of an integrated circuit. In particular, such an algorithm may be used to determine if the measured $I_{DDQ}$ value of the test structure is within an anticipated range for the integrated circuit. In addition, the algorithm may be used in embodiments in which $I_{DDQ}$ values of a plurality of test structures are measured. The plurality could include p-type, n-type or a combination of p-type and n-type test structures. Using an algorithm in such an embodiment may aid in all determining a more accurate $I_{DDQ}$ test limit for an integrated circuit. In particular, the algorithm may be used to statically characterize the $I_{DDQ}$ values of a plurality of test structures such that an average $I_{DDQ}$ value may be determined. In other words, such an algorithm may be used to determine an average $I_{DDQ}$ value of the values that are obtained within a specified range, such that $I_{DDQ}$ values obtained outside such a range are discarded.

In yet other embodiments, an algorithm may be used for adjusting the $I_{DDQ}$ test limit for a given die. For example, an algorithm may be used for adjusting the $I_{DDQ}$ test limit for a particular die that is located on a different die or a different wafer than the integrated circuit. In particular, the algorithm may be adapted to adjust the $I_{DDQ}$ test limit for integrated circuits located at the edge of the wafer versus the center of the wafer. In such an embodiment, the $I_{DDQ}$ values of devices formed at the outer edge of a wafer may be different than $I_{DDQ}$ values of devices formed in the center of the wafer. As such, the adjustment of $I_{DDQ}$ test limit may more accurately represent the anticipated $I_{DDQ}$ value of an integrated circuit. In this manner, the algorithm may be able to account for variations of $I_{DDQ}$ values that may occur across a semiconductor wafer or from wafer to wafer.

Subsequent to the measurement of the $I_{DDQ}$ value of the test structure, the method may include setting the $I_{DDQ}$ test limit of the integrated circuit based upon the measured $I_{DDQ}$ value of the test structure. As indicated in step 16 of FIG. 1, setting such an $I_{DDQ}$ test limit preferably includes correlating the $I_{DDQ}$ value of the test structure to calibration data to determine the $I_{DDQ}$ test limit of the integrated circuit. In some embodiments, setting such an $I_{DDQ}$ test limit may include correlating the $I_{DDQ}$ values of a plurality of test structures to the calibration data. Such calibration data may be specific to the design of the integrated circuit. More specifically, the calibration data may be representative of circuits fabricated using similar process parameters and fabrication sequences as the integrated circuit being analyzed. In addition, the calibration data may include correlation factors for embodiments in which the substrate leakage current of the test structure is deliberately increased. In particular, the calibration data may include correlation factors for embodiments in which the test structure includes an aspect ratio sufficient to generate a substrate leakage current which is detectable by the automatic test equipment (ATE) used to measure the $I_{DDQ}$ value of the test structure. In addition or alternatively, the calibration data may include correlation factors for embodiments, which include applying a back bias or increasing the temperature of the test structure such that the substrate leakage current of the test structure may be increased.

The method described herein may be conducted when the test structure and/or integrated circuit to be analyzed is included within a semiconductor wafer or when the test structure and/or integrated circuit is separated from a wafer. As such, the method described herein may further include dicing each wafer of a lot of wafers containing the test structure and integrated circuit. In some embodiments, measuring the $I_{DDQ}$ value of the test structure may be conducted prior to dicing the wafer. In this manner, measuring the $I_{DDQ}$ value of the test structure may be conducted during or subsequent to the fabrication of the test structure and/or integrated circuit. In other embodiments, measuring the $I_{DDQ}$ value of the test structure may be conducted subsequent to dicing the wafer. As such, measuring the $I_{DDQ}$ value of the test structure may be conducted subsequent to the fabrication of the test structure and/or integrated circuit. For example, measuring the $I_{DDQ}$ value of the test structure may be conducted after the packaging operation of the integrated circuit.

It will be appreciated to those skilled in the art having the benefit of this disclosure that this invention is believed to provide a method and a system for determining an $I_{DDQ}$ test limit for an integrated circuit. Further modifications and alternative embodiments of various aspects of the invention will be apparent to those skilled in the art in view of this description. For example, the test structure described herein may be used to determine the $I_{DDQ}$ test limit for a plurality of integrated circuits, particularly circuits formed within a same wafer lot or wafer. It is intended that the following claims be interpreted to embrace all such modifications and changes and, accordingly, the drawings and the specification are to be regarded in an illustrative rather than a restrictive sense.

What is claimed is:

1. A method for determining an $I_{DDQ}$ test limit for an integrated circuit, comprising:
    measuring the $I_{DDQ}$ value of a test structure formed upon a die, wherein said die is derived from the same lot of wafers as the integrated circuit; and
    setting the $I_{DDQ}$ test limit of the integrated circuit based upon the measured $I_{DDQ}$ value of the test structure.

2. The method of claim 1, wherein said die is derived from the same wafer as the integrated circuit.

3. The method of claim 2, wherein said die is derived from the same region of the wafer as the integrated circuit.

4. The method of claim 3, wherein said die comprises the integrated circuit.

5. The method of claim 1, wherein said setting comprises correlating the $I_{DDQ}$ value to calibration data to determine the $I_{DDQ}$ test limit.

6. The method of claim 1, further comprising applying a back bias to the test structure prior to said measuring.

7. The method of claim 6, wherein said applying comprises increasing a substrate leakage current of the test structure to a level detectable by automatic test equipment used to measure the $I_{DDQ}$ current of the test structure.

8. The method of claim 6, wherein said applying comprises increasing a substrate leakage current of the test structure to a level of the same order of magnitude as an intrinsic substrate leakage current of the integrated circuit.

9. The method of claim 1, further comprising raising a temperature of the test structure prior to said measuring.

10. The method of claim 9, wherein said raising the temperature comprises increasing a substrate leakage current of the test structure to a level detectable by automatic test equipment used to measure the $I_{DDQ}$ current of the test structure.

11. The method of claim 1, further comprising forming one or more test structures on each die of the lot of wafers, wherein said one or more test structures comprises said test structure.

12. The method of claim 11, wherein said measuring comprises measuring $I_{DDQ}$ values of a plurality of said one or more test structures; and wherein said setting comprises setting the $I_{DDQ}$ test limit of the integrated circuit based upon the measured $I_{DDQ}$ values.

13. The method of claim 1, further comprising dicing each wafer of said lot of wafers.

14. The method of claim 13, wherein said measuring is conducted prior to said dicing.

15. The method of claim 13, wherein said measuring is conducted subsequent to said dicing.

16. A means for determining an $I_{DDQ}$ test limit of an integrated circuit, comprising:
    a test structure formed upon a die, wherein said die is derived from the same lot of wafers as a die upon which the integrated circuit is formed; and
    calibration data adapted to correlate an $I_{DDQ}$ value measured from the test structure to the $I_{DDQ}$ test limit of the integrated circuit.

17. The means of claim 16, wherein the die upon which the test structure is formed is derived from the same wafer as the die upon which the integrated circuit is formed.

18. The means of claim 16, wherein said test structure is formed upon the same die as the integrated circuit.

19. The means of claim 16, further comprising one or more additional test structures formed upon other die derived from said lot of wafers, wherein said calibration data is further adapted to correlate $I_{DDQ}$ values measured from the one or more additional test structures to the $I_{DDQ}$ test limit of the integrated circuit.

20. The means of claim 16, wherein said test structure comprises an aspect ratio sufficient to generate a substrate leakage current of the test structure to a level detectable by an automatic test equipment used to measure the $I_{DDQ}$ current of the test structure.

21. The means of claim 16, further comprising a means for increasing a substrate leakage current of the test structure to a level detectable by automatic test equipment used to measure the $I_{DDQ}$ value of the test structure.

22. The means of claim 21, wherein said means for increasing the substrate leakage current of the test structure is further adapted to increase the substrate leakage current of the test structure to a level of the same order of magnitude as an intrinsic substrate leakage current of the integrated circuit.

23. The means of claim 21, wherein said means for increasing the substrate leakage current of the test structure comprises a back bias.

24. The means of claim 23, wherein said back bias is arranged within a semiconductor topography comprising the test structure.

25. The means of claim 21, wherein said means for increasing the substrate leakage current of the test structure comprises a resistance network adapted to increase the temperature of the test structure.

26. The means of claim 16, wherein said test structure is electrically isolated from the integrated circuit.

* * * * *